United States Patent [19]
Hawley

[11] Patent Number: 5,464,790
[45] Date of Patent: Nov. 7, 1995

[54] METHOD OF FABRICATING AN ANTIFUSE ELEMENT HAVING AN ETCH-STOP DIELECTRIC LAYER

[75] Inventor: Frank W. Hawley, Campbell, Calif.

[73] Assignee: Actel Corporation, Sunnyvale, Calif.

[21] Appl. No.: 282,145

[22] Filed: Jul. 28, 1994

Related U.S. Application Data

[62] Division of Ser. No. 197,102, Feb. 15, 1994, which is a continuation of Ser. No. 950,264, Sep. 23, 1992, abandoned.

[51] Int. Cl.$^6$ ............................. H01L 21/70; H01L 27/00
[52] U.S. Cl. ..................... 437/60; 437/228; 437/195; 437/170; 437/922
[58] Field of Search ............................ 437/922, 60, 228, 437/170, 195; 257/530, 50

[56] References Cited

U.S. PATENT DOCUMENTS

| | | | |
|---|---|---|---|
| 4,561,409 | 3/1987 | Ellsworth et al. | 29/576 B |
| 4,748,490 | 5/1988 | Hollingsworth | 357/51 |
| 4,796,075 | 1/1989 | Whitten | 357/51 |
| 4,822,753 | 4/1989 | Pintchovski | 437/192 |
| 4,847,732 | 7/1989 | Stopper et al. | 361/395 |
| 4,870,302 | 9/1989 | Freeman | 307/465 |
| 4,899,205 | 2/1990 | Hamdy et al. | 357/51 |
| 4,914,055 | 4/1990 | Gordon et al. | 437/192 |
| 4,933,576 | 6/1990 | Tamamura et al. | 307/465 |
| 4,943,538 | 7/1990 | Mohsen et al. | 437/52 |
| 5,070,384 | 12/1991 | McCollum et al. | 357/51 |
| 5,095,362 | 3/1992 | Roesner | 357/23.4 |
| 5,100,827 | 3/1992 | Lytle | 437/52 |
| 5,120,679 | 6/1992 | Boardman et al. | 437/195 |
| 5,134,457 | 7/1992 | Hamdy et al. | 357/51 |
| 5,166,556 | 11/1992 | Hsu et al. | 307/465 |
| 5,171,715 | 12/1992 | Husher et al. | 437/195 |
| 5,194,759 | 3/1993 | El-Ayat et al. | 307/202.1 |
| 5,196,724 | 3/1993 | Gordon et al. | 257/530 |
| 5,233,217 | 8/1993 | Dixit et al. | 257/530 |
| 5,250,464 | 10/1993 | Wong et al. | 437/170 |
| 5,266,829 | 11/1993 | Hamdy et al. | 257/530 |
| 5,272,101 | 12/1993 | Forouhi et al. | 437/44 |
| 5,272,666 | 12/1993 | Tsang et al. | 365/96 |
| 5,290,734 | 3/1994 | Boardman et al. | 437/195 |
| 5,300,456 | 4/1994 | Tigelaar et al. | 437/195 |
| 5,308,795 | 5/1994 | Hawley et al. | 437/195 |
| 5,322,812 | 6/1994 | Dixit et al. | 437/60 |
| 5,384,481 | 1/1995 | Halzworth et al. | 257/530 |

FOREIGN PATENT DOCUMENTS

| | | |
|---|---|---|
| 0455414 | 4/1991 | European Pat. Off. . |
| 9213359 | 1/1992 | European Pat. Off. . |
| 9220109 | 4/1992 | European Pat. Off. . |
| 9303499 | 7/1992 | European Pat. Off. . |
| 8700969 | 7/1986 | WIPO . |
| 8702827 | 10/1986 | WIPO . |

*Primary Examiner*—Olik Chaudhuri
*Assistant Examiner*—H. Jey Tsai
*Attorney, Agent, or Firm*—D'Alessandro & Ritchie

[57] ABSTRACT

A dielectric layer through which an antifuse via or an antifuse contact via is to be formed comprises a sandwich of at least two, and preferably three, individual layers. A first etch-stop dielectric layer is disposed over an underlying layer comprising either a lower or upper antifuse electrode barrier layer or an antifuse material layer. The first etch-stop dielectric layer comprises a thin layer of dielectric material. An isolation dielectric layer is disposed over the first etch-stop dielectric layer and comprises a second material comprising most of the thickness of the sandwich and having a substantial etch-time differential from the first etch-stop dielectric material for a selected etchant for the first etch-stop dielectric material. A second etch-stop dielectric layer may be provided under the first etch-stop dielectric layer and may be formed from a third material having a substantial etch time differential from the first etch-stop dielectric material for a selected etchant for the first material. A process for forming a via according to the present invention comprises, in order, the steps of forming the first etch-stop, isolation, masking the sandwich of dielectric layers for formation of a via; etching the isolation dielectric layer with an over-etch, stopping on the underlying first etch-stop dielectric layer; etching the first etch-stop dielectric layer with high over-etch, stopping on the layer beneath it.

10 Claims, 6 Drawing Sheets

METHOD OF FABRICATING AN ANTIFUSE ELEMENT HAVING AN ETCH-STOP DIELECTRIC LAYER

CROSS-REFERENCE TO RELATED APPLICATIONS

This is a divisional of U.S. Pat. application Ser. No. 08/197,102, filed Feb. 15, 1994 in the name of inventor Frank Hawley which is a continuation of U.S. patent application Ser. No. 07/950,264 filed Sep. 23, 1992, now abandoned. All of the above-identified patent applications are commonly owned by Actel Corporation.

BACKGROUND OF THE INVENTION

1. Field of the Invention

The present invention relates to antifuse technology and to methods for fabricating antifuse elements. More particularly, the present invention relates to methods for fabricating antifuses which minimize the damage to antifuse films during the etch steps performed to form antifuse vias or antifuse contact vias.

2. The Prior Art

Antifuse fabrication processes universally employ an etching step which is used to form an antifuse via in an inter-electrode dielectric layer :which separates the upper and lower antifuse electrodes. During this etching step, it is important to protect the underlying layer of material whether it be an already-formed antifuse material (such as amorphous silicon, silicon dioxide or silicon nitride or some combination thereof) or the upper surface of the upper or lower antifuse electrode (comprising a material such as TiW, Ti, TiN, TiW:N or some other effective metallic barrier film). Where an amorphous silicon antifuse material is employed it is important to maintain the integrity of the barrier layer protecting the amorphous silicon antifuse layer from metal diffusion. A certain barrier metal thickness must be maintained in order to prevent diffusion of atoms from the electrodes into the amorphous silicon. Such contamination degrades the performance of the amorphous silicon dielectric. It is also important to maintain the as-deposited thickness of the amorphous silicon in order to maintain control of the voltage at which the antifuse material will rupture.

In some antifuse structures, the lower antifuse electrode comprises a first metal interconnect layer and the upper electrode of the antifuse comprises a barrier layer to which electrical connection is made through an antifuse contact via etched through a dielectric layer underlying a second metal interconnect layer. In such embodiments, the upper electrode/barrier layer protects the underlying antifuse material from diffusion of atoms from the second metal interconnect layer. It is important to maintain the integrity of this upper electrode/barrier layer to protect the underlying amorphous silicon antifuse layer from metal diffusion.

When either an antifuse via or an antifuse contact via is etched through a traditional continuous dielectric film, such as PECVD oxide, either the antifuse material or the barrier layer over the lower electrode is exposed to the etch during the final over-etch portion of the etch step. Since a typical over-etch is specified at from about 30–60% of the etch time, the exposure of the antifuse material or the barrier layer during the over-etch process will damage these layers. The typical via depth through an intermetal dielectric layer is between about 0.5–1.0 microns deep, and the antifuse material or lower electrode barrier layer is relatively thin, i.e., between about 0.1 to 0.3 microns. Both the antifuse material layer and the barrier layer are sensitive to the loss of 100 angstroms of material. It is thus important to find a way to minimize the amount of via overetch to which these films are exposed.

BRIEF DESCRIPTION OF THE INVENTION

According to the present invention, an interlayer dielectric layer through which an antifuse via or an antifuse contact via is to be formed comprises a sandwich of at least two, and preferably three, individual layers. A first etch-stop dielectric layer is disposed over an underlying layer comprising either a lower or upper antifuse electrode barrier layer or an antifuse material layer. The first etch-stop dielectric layer comprises a thin layer of a first dielectric material. An isolation dielectric layer is disposed over the first etch-stop dielectric layer and comprises a second material comprising most of the thickness of the sandwich and having a substantial etch-time differential from the first material for a selected etchant for the first material. A second etch-stop dielectric layer may be provided under the first etch-stop dielectric layer and may be formed from a third material having a substantial etch time differential from the first material for a selected etchant for the first material. The additional dielectric layer may comprise the second material.

The compositions and thicknesses of the first and second etch-stop dielectric layers can be adjusted so as to act as etch stops during the via etch. This acts to reduce the amount of etch exposure the material at the bottom of the via will see, thus reducing the amount of etch damage the bottom material incurs.

According to a presently preferred embodiment of the invention, the first etch-stop dielectric layer may comprise a thin layer of silicon nitride, the isolation dielectric layer may comprise a thick layer of silicon dioxide. The second etch-stop dielectric layer, if used, may comprise a thin layer of silicon dioxide.

As a part of an antifuse fabrication process according to the present invention, a via etch process includes the steps of first etching the isolation dielectric layer with a high % over-etch (i.e., 50%) using an etchant having a high selectivity between the materials comprising the isolation dielectric and first etch-stop dielectric layers, stopping on the underlying first etch-stop dielectric layer; next, etching the first-etch-stop dielectric layer with high % over-etch (i.e., 50%), using an etchant having a high selectivity between the materials comprising the first etch-stop dielectric layer and the layer beneath it, stopping on the underlying layer. According to a first embodiment of the invention, the underlying layer will comprise either the barrier layer or the antifuse material layer, depending on the antifuse structure employed. According to a second embodiment of the invention, the underlying layer will comprise the second etch-stop dielectric layer, and a third step of the process comprises etching the second etch-stop dielectric layer with a high % over-etch (i.e., 50%) using an etchant having a high selectivity between the materials comprising the second etch-stop dielectric layer and the underlying barrier layer or antifuse material layer, stopping on the underlying layer. With short etch time exposure and good selectivity, the potential etch damage to the underlying antifuse layer or barrier layer is minimized while providing a reliable via etch process.

BRIEF DESCRIPTION OF THE DRAWINGS

FIG. 4a is a flow diagram illustrating the process for fabricating the antifuse structure of FIG. 3a.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
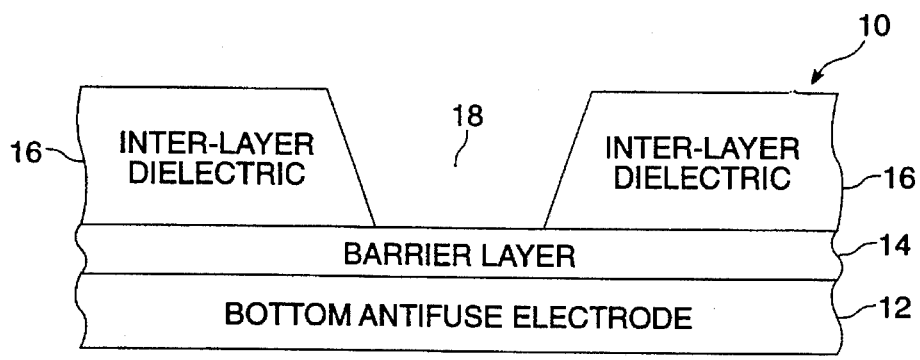
FIGS. 1a–1c are cross-sectional views of three different antifuse structures processed through via formation, illustrating the problem solved by the present invention.
Figure 1B:
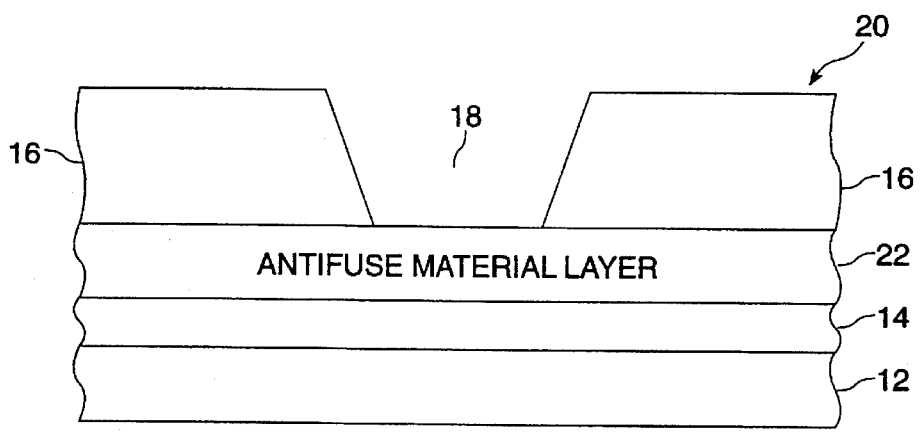
Figure 1C:
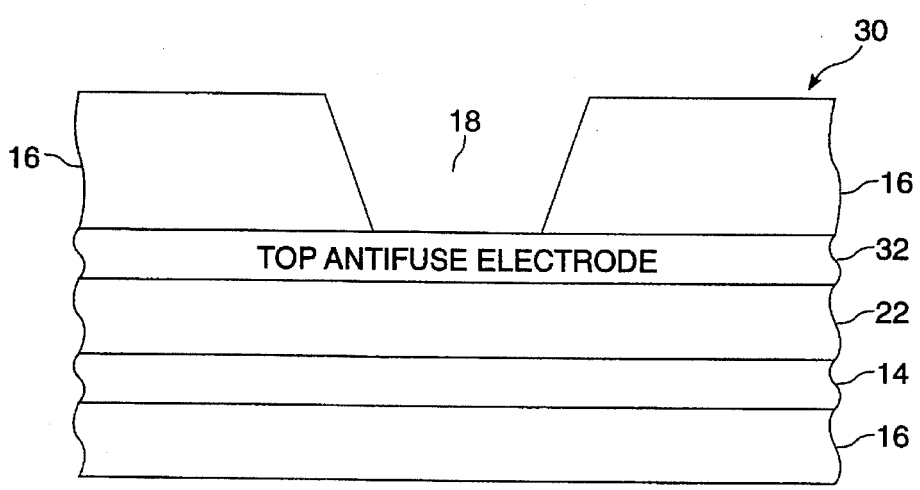

Referring first to FIGS. 1a–1c, cross sectional views are presented of three different antifuse structures which illustrate the problem solved by the present invention. The antifuse structures depicted in FIGS. 1a–1c have been processed through via formation.

FIG. 1a depicts an antifuse structure 10 wherein a lower electrode 12 comprises a metal interconnect layer in an integrated circuit. Such interconnect layers are typically formed from an alloy of Al/Si/Cu. A lower electrode barrier layer 14 is disposed over lower electrode 12. The function of lower electrode barrier layer 14 is to prevent diffusion of atoms from the material comprising lower electrode 12 into the antifuse material layer which is disposed over lower electrode barrier layer 14. Lower electrode barrier layer 14 may comprise materials such as Ti:W, Ti:N, Ti:W:N, etc.

An interlayer dielectric layer 16 is disposed over lower electrode barrier layer 14. Interlayer dielectric layer 16 usually comprises a thick layer of a material such as PECVD silicon dioxide. An antifuse via 18 is etched through interlayer dielectric layer 18 to expose the upper surface of barrier layer 14.

At the point in the fabrication process depicted in FIG. 1a, an antifuse material layer will be formed in antifuse via 18. Later an upper electrode barrier layer and an upper electrode will be formed over the antifuse material layer to complete the antifuse structure.

Referring now to FIG. 1b, it may be seen that antifuse structure 20 depicted therein is similar to antifuse structure 10 of FIG. 1a. The difference is that antifuse material layer 22 is disposed over lower electrode barrier layer 14 prior to the formation of interlayer dielectric layer 16. Antifuse material layer typically comprises a layer of amorphous silicon, but may also comprise other materials, such as one or more layers of dielectric materials, such as silicon dioxide, silicon nitride, etc. Those of ordinary skill in the art will be familiar with the various compositions used for antifuse material layer 16. Antifuse via 18 is etched through interlayer dielectric layer 18 to expose the upper surface of antifuse material layer 22.

At the point in the fabrication process depicted in FIG. 1b, an upper electrode barrier layer and an upper electrode will be formed in via 18 over the antifuse material layer to complete the antifuse structure.

Referring now to FIG. 1c, it may be seen that antifuse structure 30 depicted therein is similar to antifuse structure 20 of FIG. 1b. The difference is that top antifuse electrode barrier layer 32, which may comprise a barrier material similar to lower electrode barrier layer 14, is disposed over antifuse material layer 22 prior to the formation of interlayer dielectric layer 16. Antifuse via 18 is etched through interlayer dielectric layer 16 to expose the upper surface of the top antifuse electrode barrier layer 22.

Unlike the embodiments of FIGS. 1a and 1b, the entire antifuse structure is already formed before interlayer dielectric layer 16 is formed in the embodiment of FIG. 1c. The function of interlayer dielectric layer 16 is to isolate the completed antifuse structure from a metal interconnect layer which will later be formed.

At the point in the fabrication process depicted in FIG. 1c, a metal interconnect layer will be formed in via 18 over the antifuse material layer to complete the antifuse structure.

Those of ordinary skill in the art will recognize that an antifuse material comprising one or more thin dielectric layers may be substituted for the amorphous silicon in any of the embodiments of FIGS. 1a–1c. Where dielectric layers such as ONO are employed as the antifuse material, the barrier layers between which the antifuse material is sandwiched should comprise a material such as Ti:W:N, since Ti:W will react with silicon dioxide.

In the processes used to fabricate the structures depicted in FIGS. 1a–1c, via 18 is formed using an etching process to remove a portion of the interlayer dielectric layer 16 to define the via 18. Such an etching process is conventional and is performed by first masking the surface of the interlayer dielectric layer 16 to define the via 18. the exposed portion of the interlayer dielectric layer 16 is then subjected to either chemical or reactive etching as is known in the art.

Those of ordinary skill in the art will recognize that conventional etching techniques employ an "over-etch" step to assure removal of all of the material which it is desired to remove. Typical over-etch procedures comprise continuing the etch process for a period of time equal to between about 30–70% of the nominal etch time required to remove the thickness of the material which it is desired to remove.

When performing the via etch step in the structure of FIG. 1a, the lower electrode barrier layer 14 is exposed to the over-etch step. Similarly, when performing the via etch step in the structure of FIG. 1b, the antifuse material layer 22 is exposed to the over-etch step, and when performing the via etch step in the structure of FIG. 1c, the upper electrode 32 is exposed to the over-etch step. The effect of over-etch process on layers 14, 22, and 32 leads to degradation of the finished antifuse. In the embodiments of FIGS. 1a and 1c, the over-etch process will cause an unintentional thinning of the upper or lower barrier layers which prevent metal diffusion into the antifuse material layer 22. The effect of thinning of either of these barrier layers reduces their effectiveness and increases the possibility that metal atoms from the lower electrode (the embodiment of FIG. 1a) or the upper metal interconnect layer (the embodiment of FIG. 1c) will diffuse into the antifuse material layer, thus unpredictably lowering its breakdown (i.e., programming) voltage or otherwise degrading it.

Figure 2A:
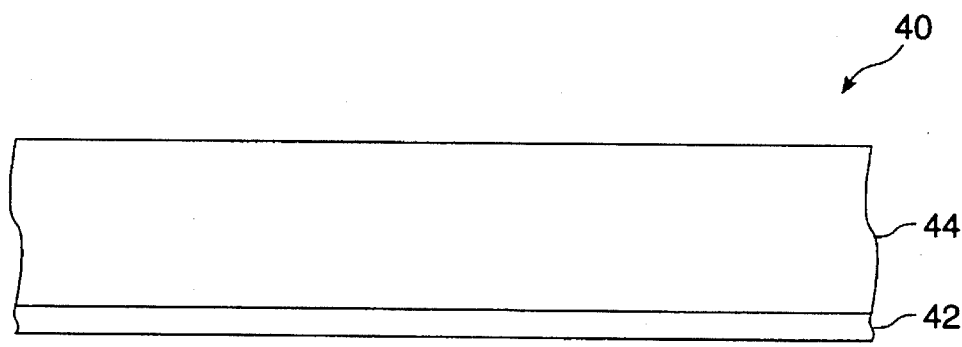
FIG. 2a is a cross-sectional view of an interlayer dielectric layer for employment in an antifuse structure according to a first embodiment of the present invention is shown.
Figure 2B:
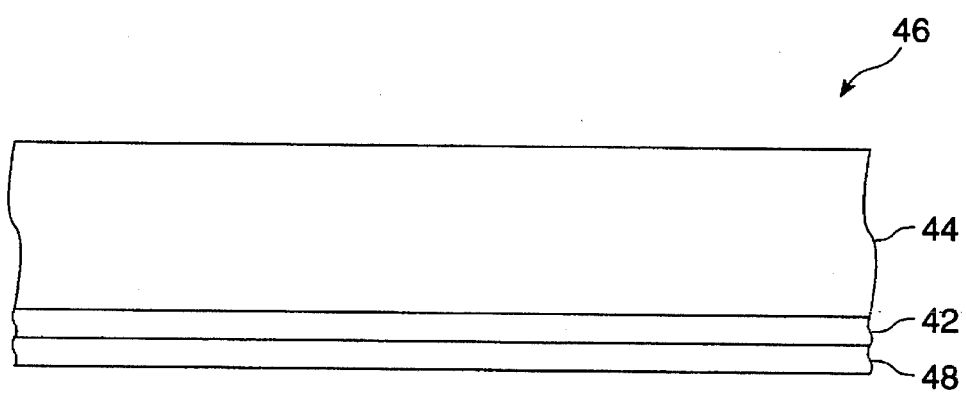
FIG. 2b is a cross-sectional view of an interlayer dielectric layer for employment in an antifuse structure according to a second embodiment of the present invention is shown.

Referring now to FIGS. 2a and 2b, an interlayer dielectric according to first and second embodiments, respectively, of the present invention are shown. Referring first to FIG. 2a, an interlayer dielectric layer 40 for employment in an antifuse according to a first embodiment of the present invention is depicted in cross-sectional view. A first etch-stop dielectric layer 42 of the interlayer dielectric layer 40 comprises a thin layer of dielectric material which can be etched selectively with respect to the layer upon which it is disposed. For example, in the embodiment of FIG. 1a, the first etch-stop dielectric layer 42 is disposed over the lower electrode barrier layer 14. A layer of PECVD nitride having a thickness of between about 200 to 2,000 angstroms, preferably about 1,000 angstroms may be employed for this layer.

An isolation dielectric layer 44 is disposed over first etch-stop dielectric layer 42. Isolation dielectric layer 44 is formed from a layer of dielectric material which can be etched selectively with respect to first etch-stop dielectric layer 42 and may comprise a thick layer of PECVD silicon dioxide. This layer may have a thickness of between about 4,000 to 9,000 angstroms, and preferably about 7,000 angstroms.

The isolation dielectric layer 44 serves as the interlayer isolation. The first etch-stop dielectric layer 42 functions as an etch stop for isolation dielectric layer 44, allowing a complete overetch of the via through isolation dielectric layer 44 without etching thru the thin nitride layer comprising first etch-stop dielectric layer 42 and attacking the underlying layer of antifuse material or barrier material. This is due to the etch rate selectivity between the two dielectric materials, such as oxide and nitride.

Referring now to FIG. 2b, an interlayer dielectric 46 according to a second embodiment of the present invention is shown in cross-sectional view. A second etch-stop dielectric layer 48 comprises a thin layer of dielectric material which can be etched selectively with respect to the layer upon which it is disposed. For example, in the embodiment of FIG. 1a, the second etch-stop dielectric layer 48 is disposed over the lower electrode barrier layer 14. A layer of PECVD silicon dioxide having a thickness of between about 200 to 2,000 angstroms, preferably about 1,000 angstroms may be employed for this layer.

A first etch-stop dielectric layer 42 of the interlayer dielectric layer 46 comprises a thin layer of dielectric material which can be etched selectively with respect to the second etch-stop dielectric layer 48 upon which it is disposed. A layer of PECVD nitride having a thickness of between about 200 to 2,000 angstroms, preferably about 1,000 angstroms may be employed for this layer.

An isolation dielectric layer 44 is disposed over first etch-stop dielectric layer 42. Second etch-stop dielectric layer 44 comprises a thick layer of dielectric material which can be etched selectively with respect to the first etch-stop dielectric layer 42 upon which it is disposed, and may comprise a thick layer of PECVD silicon dioxide. This layer may have a thickness of between about 4,000 to 9,000 angstroms, and preferably about 7,000 angstroms.

In the embodiment of FIG. 2b, the isolation dielectric layer 44 serves as the principal interlayer isolation element. The first etch-stop dielectric layer 42 functions as an etch stop for isolation dielectric layer 44, allowing a complete overetch of the via through isolation dielectric layer 44 without etching thru the thin nitride layer comprising first etch-stop dielectric layer 42.

The second etch-stop dielectric layer 48 functions as an etch stop for the first etch-stop dielectric layer etch, allowing for an overetch to clear all the first etch-stop dielectric layer 42 thin nitride film away without etching through the isolation dielectric layer thin oxide. The second etch-stop dielectric layer 48 is added because there is a better etch selectivity between silicon dioxide and amorphous silicon and barrier layer materials than between silicon nitride and those materials. After the second etch-stop dielectric layer 48 is cleared away, the underlying antifuse material or barrier layer material is exposed to only a very short, highly selective etch, thus giving a soft etch on the underlying material. This minimizes the etch damage to the underlying material. This is a more reliable and controllable manufacturing process than is employed in the prior art.

Figure 3A:
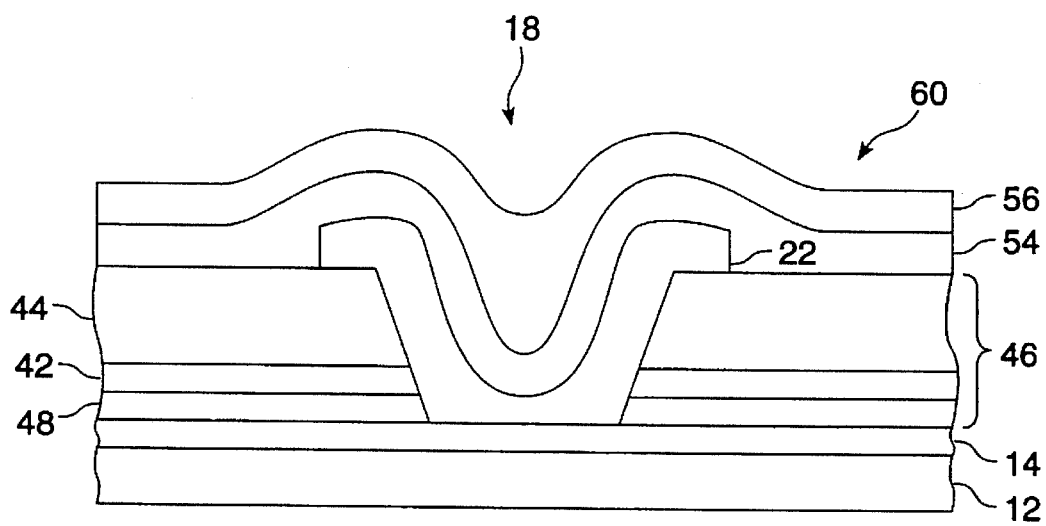
FIG. 3a is a cross-sectional view of an antifuse structure according to a first embodiment of the present invention.
Figure 3B:
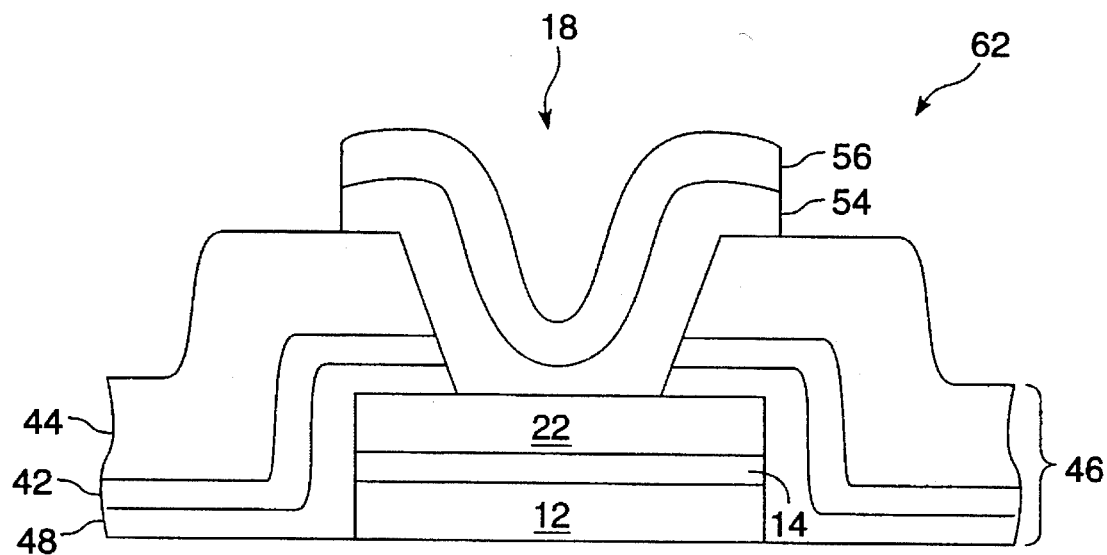
FIG. 3b is a cross-sectional view of an antifuse structure according to a second embodiment of the present invention.
Figure 3C:
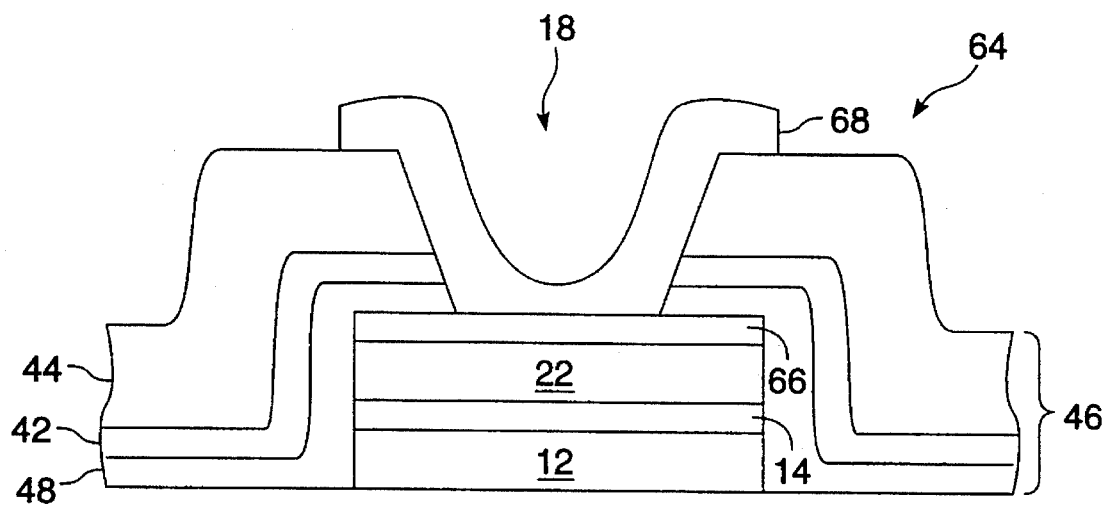
FIG. 3c is a cross-sectional view of an antifuse structure according to a third embodiment of the present invention.

FIGS. 3a–3c illustrate the antifuse structures according to the present invention utilizing the interlayer dielectrics of FIG. 2b. The embodiments of FIGS. 3a–3c correspond to the antifuse structures depicted in FIGS 1a–1c, respectively. Like reference numerals have been employed for like structures in FIGS. 1a–1c and FIGS. 3a–3c.

FIG. 3a depicts a cross-sectional view of a metal-to-metal antifuse 60 according to a first embodiment of the present invention which may be disposed between two metal interconnect layers. Bottom electrode 12 comprises a first metal interconnect layer and is covered by a barrier layer 14, which may be typically employed in a 0.8 micron CMOS process as a barrier and anti-reflective layer. Interlayer dielectric 46 comprises second etch-stop dielectric layer 48, first etch-stop dielectric layer 42, and isolation dielectric layer 44. Antifuse via 18 is formed therein and antifuse material layer 22 is formed in antifuse via 18. An upper barrier layer 54 is formed over antifuse material layer 22, and second metal interconnect layer 56 is formed over upper barrier layer 54. Those of ordinary skill in the art will recognize that if the interlayer dielectric of FIG. 2a is employed, second etch-stop dielectric layer 48 will be omitted, and first etch-stop dielectric layer 42 will be disposed directly over lower electrode barrier layer 14.

FIG. 3b depicts a cross-sectional view of a metal-to-metal antifuse 62 according to a second embodiment of the present invention which may be disposed between two metal interconnect layers. Antifuse 62 is similar to antifuse 60, except that antifuse layer 22 is disposed over bottom electrode barrier layer 14 and the stacked layers of lower electrode 12, barrier layer 14, and antifuse layer 22 are usually defined prior to the formation of interlayer dielectric layer 46 in order to minimize the capacitance of the antifuse. Interlayer dielectric 46 comprises second etch-stop dielectric layer 48, first etch-stop dielectric layer 42, and isolation dielectric layer 44. Antifuse via 18 is formed therein to expose antifuse material layer 22. An upper barrier layer 54 is formed in antifuse via 18, and second metal interconnect layer 56 is formed over upper barrier layer 54. As in the embodiment disclosed in FIG. 3a, those of ordinary skill in the art will recognize that if the interlayer dielectric of FIG. 2a is employed, second etch-stop dielectric layer 48 will be omitted, and first etch-stop dielectric layer 42 will be disposed directly over lower electrode barrier layer 14.

FIG. 3c depicts a cross-sectional view of a metal-to-metal antifuse 64 according to a third aspect of the present invention. Unlike the embodiments depicted in FIGS. 3a and 3b, antifuse 64 is completely contained beneath interlayer dielectric layer 46. In this embodiment, therefore, the via 18 is more accurately referred to as a contact via. As shown in FIG. 3c, bottom electrode 12, barrier layer 14, antifuse material layer 22, and upper antifuse electrode 66, formed from a barrier material, are defined prior to formation of Interlayer dielectric 46, which comprises second etch-stop dielectric layer 48, first etch-stop dielectric layer 42, and isolation dielectric layer 44. Second metal interconnect layer 68 is formed in contact via 18.

Figure 4A:
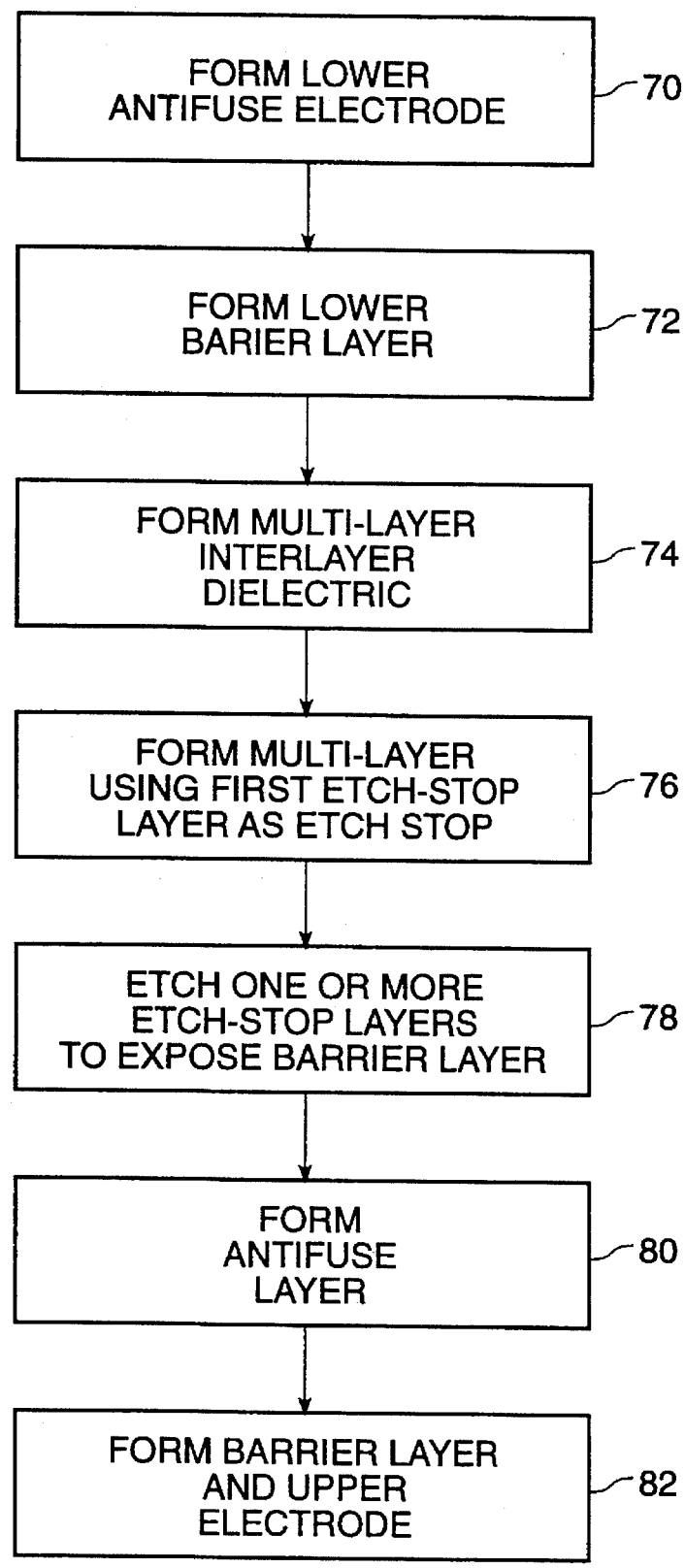

Referring now to FIG. 4a, a flow diagram illustrates the process for fabricating the antifuse structure illustrated in FIG. 3a. Reference numerals to the corresponding structures of FIG. 3a will also be used. First, at step 70, the lower antifuse electrode 12 is formed. This electrode may comprise a metal interconnect layer and may be formed from a material such as Al/Si/Cu having a thickness of about 4,500 angstroms as is known in the art, or from other materials used to form interconnect layers in integrated circuits.

At step 72, barrier layer 14 is formed from a known barrier layer material such as Ti:W, TiN, or Ti:W:N, to a thickness of about 3,000 angstroms. Next, at step 74, interlayer dielectric 40 (FIG. 2a) or 46 (FIG. 2b) is formed. If a three-layer structure is to be formed, a second etch-stop dielectric layer 48 which may comprise from about 200 to 2,000 angstroms of PECVD silicon dioxide is formed over the surface of barrier layer. A first etch-stop dielectric layer 42, which may comprise from about 200 to 2,000 angstroms of PECVD silicon nitride, is formed, either over second etch-stop dielectric layer 48 if a three-layer interlayer dielectric layer structure is to be formed, or over barrier layer 14 if a two-layer interlayer dielectric layer is to be formed. Finally, isolation dielectric layer 44 is formed over the surface of first etch-stop dielectric layer 42.

At this point in the process, the antifuse via 18 will be formed. First, isolation dielectric layer 44 is suitably masked, using conventional photolithography techniques. At step 76, an etching step is used to etch via 18 through isolation dielectric layer using an etchant which is highly selective between isolation dielectric layer 44 and first etch-stop dielectric layer 42. Etchants such as $CHF_3:O_2$ with a 6:1 ratio are suitable for this procedure. An overetch procedure of from about 30–70%, preferably about 50% is employed.

Next, at step 78, the one or more etch stop dielectric layers are removed. The via is etched into first etch-stop dielectric layer 42 etched using an etchant having a high selectivity between first etch-stop dielectric layer 42 and the underlying layer. When a three-layer interlayer dielectric layer is employed, the underlying layer will be second etch-stop dielectric layer 48, preferably formed from silicon dioxide, and an etchant such as $CHF_3:O_2$ with a 1:4 ratio may be employed. When a two-layer interlayer dielectric layer is employed, the underlying layer will be barrier layer 14, and an etchant such as $CHF_3:O_2$ with a 1:4 ratio may be employed. An overetch procedure of from about 30–70%, preferably about 50% is employed.

If a three-layer interlayer dielectric layer is employed, a final etching step is performed to continue via 18 through second etch-stop dielectric layer 48 using an etchant having a high selectivity between second etch-stop dielectric layer 48 and barrier layer 14. An overetch procedure of from about 30–70% (preferably about 50%) is employed. This will etch very little into barrier layer 14 because of the high selectivity and the short actual overetch time used when etching a thin oxide.

Next, after removal of the via masking layer by conventional processing techniques, an antifuse layer 22 is formed in via 18. Antifuse layer 22 may comprise a layer of amorphous silicon having a thickness of between about 1,000–3,000 angstroms, preferably about 1,200 angstroms, and may be formed using CVD techniques. Alternatively, a single or multi-layer dielectric structure, such as a nitride (N), N/amorphous silicon, amorphous silicon/N, amorphous silicon/N/amorphous silicon, N/amorphous silicon/N, ON, NO, ONO, NON, or similar structure may be formed using PECVD techniques. Finally, an upper barrier layer 54 and upper electrode 56 may be formed at step 82 using conventional processing techniques to thickness of about 3,000 angstroms and 7,000 angstroms, respectively.

Figure 4B:
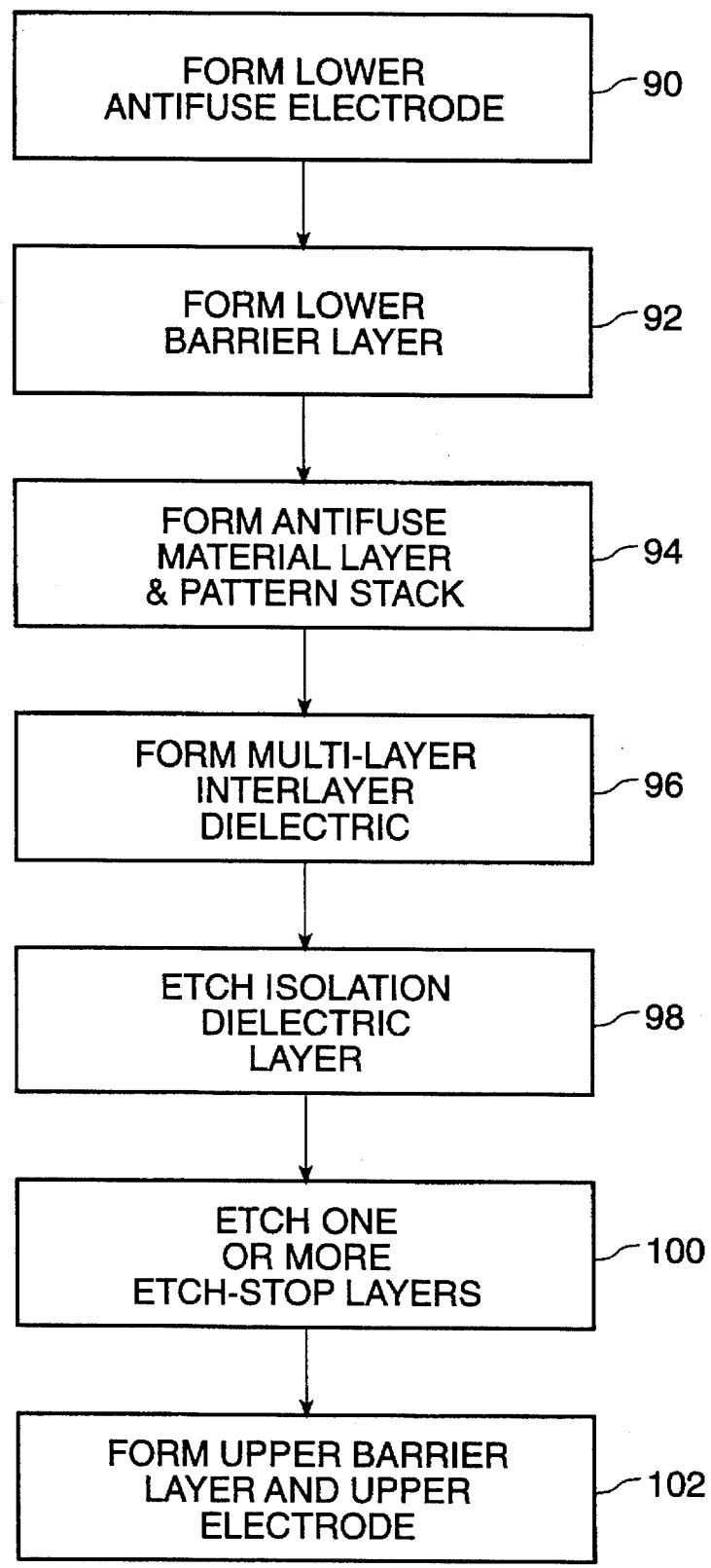
FIG. 4b is a flow diagram illustrating the process for fabricating the antifuse structure of FIG. 3b.

Referring now to FIG. 4b, a flow diagram illustrates the process for fabricating the antifuse structure illustrated in FIG. 3b. Reference numerals to the corresponding structures of FIG. 3b will also be used. First, at step 90, the lower antifuse electrode 12 is formed. This electrode may comprise a metal interconnect layer and may be formed from a material such as Al/Si/Cu having a thickness of about 4,500 angstroms as is known in the art, or from other materials used to form interconnect layers in integrated circuits.

At step 92, barrier layer 14 is formed from a known barrier layer material such as Ti:W, TiN, or Ti:W:N, to a thickness of about 3,000 angstroms. At step 94 an antifuse layer 22 is formed over barrier layer 14. Antifuse layer 22 may comprise a layer of amorphous silicon having a thickness of between about 1,000–3,000 angstroms, preferably about 1,200 angstroms, and may be formed using CVD techniques. Alternatively, a single or multilayer dielectric structure, such as those previously described may be formed using PECVD techniques. The stacked structure of lower electrode 12, barrier layer 14, and antifuse layer 22 is typically patterned and defined using conventional masking and etching techniques.

Next, at step 96, interlayer dielectric 40 (FIG. 2a) or 46 (FIG. 2b) is formed. If a three-layer structure is to be formed, a second etch-stop dielectric layer 48 which may comprise from about 200 to 2,000 angstroms of PECVD silicon dioxide is formed over the surface of barrier layer. A first etch-stop dielectric layer 42, which may comprise from about 200 to 2,000 angstroms of PECVD silicon nitride, is formed, either over second etch-stop dielectric layer 48 if a three-layer interlayer dielectric layer structure is to be formed, or over barrier layer 14 if a two-layer interlayer dielectric layer is to be formed. Finally, isolation dielectric layer 44 is formed over the surface of first etch-stop dielectric layer 42.

At this point in the process, the antifuse via 18 will be formed. First, isolation dielectric layer 44 is suitably masked, using conventional photolithography techniques. At step 98, an etching step is used to etch via 18 through isolation dielectric layer using an etchant which is highly selective between isolation dielectric layer 44 and first etch-stop dielectric layer 42. Etchants such as $CHF_3:O_2$ with a 6:1 ratio, are suitable for this procedure. An overetch procedure of from about 30–70%, preferably about 50% is employed.

Next, at step 100, the one or more etch stop dielectric layers are removed. The via is etched into first etch-stop dielectric layer 42 etched using an etchant having a high selectivity between first etch-stop dielectric layer 42 and the underlying layer. When a three-layer interlayer dielectric layer is employed, the underlying layer will be second etch-stop dielectric layer 48, preferably formed from silicon dioxide, and an etchant such $CHF_3:O_2$ with a 1:4 ratio may be employed. When a two-layer interlayer dielectric layer is employed, the underlying layer will be antifuse material layer 22, and an etchant such as $CHF_3:O_2$ with a 1:4 ratio may be employed. An overetch procedure of from about 30–70% preferably about 50% is employed.

If a three-layer interlayer dielectric layer is employed, a final etching step is performed to continue via 18 through second etch-stop dielectric layer 48 using an etchant having a high selectivity between second etch-stop dielectric layer 48 and antifuse material layer 22. An overetch procedure of from about 30–70%, preferably about 50% is employed. This will etch very little into antifuse material layer 22 because of the high selectivity and the short actual overetch time used when etching a thin oxide.

Next, after removal of the via masking layer by conventional processing techniques, upper barrier layer 54 and upper electrode 56 may be formed at step 102 using conventional processing techniques to thickness of about 3,000 angstroms and 7,000 angstroms, respectively.

Figure 4C:
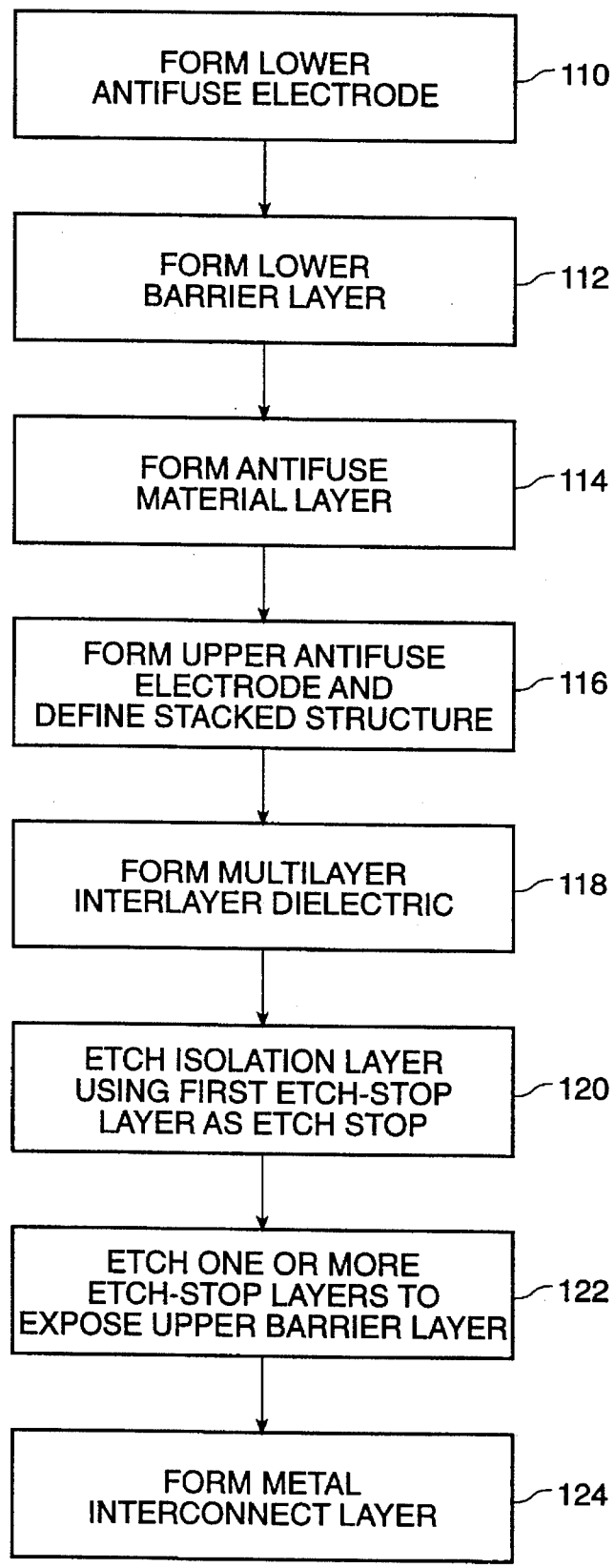
FIG. 4c is a flow diagram illustrating the process for fabricating the antifuse structure of FIG. 3c.

Referring now to FIG. 4c, a flow diagram illustrates the process for fabricating the antifuse structure illustrated in FIG. 3c. Reference numerals to the corresponding structures of FIG. 3c will also be used. First, at step 110, the lower antifuse electrode 12 formed. This electrode may comprise a metal interconnect layer and may be formed from material such as Al/Si/Cu having a thickness of about 4,500 angstroms as is known in the art, or from other materials used to form interconnect layers in integrated circuits.

At step 112, barrier layer 14 is formed from a known barrier layer material such as Ti:W, TiN, or Ti:W:N, to a thickness of about 3,000 angstroms. At step 114 an antifuse layer 22 is formed over barrier layer 14. Antifuse layer 22 may comprise a layer of amorphous silicon having a thickness of between about 1,000–3,000 angstroms, preferably about 1,200 angstroms, and may be formed using CVD techniques. Alternatively, a single or multi-layer dielectric structure, such as previously described herein may be formed using PECVD techniques. At step 116, the upper electrode barrier layer 66 is formed over the antifuse material layer 22 from a suitable barrier material to a thickness of about between 3,000 angstroms. The stacked structure of lower electrode 12, barrier layer 14, antifuse layer 22, and upper electrode barrier layer 66 is typically patterned and defined using conventional masking and etching techniques.

Next, at step 118, interlayer dielectric 40 (FIG. 2a) or 46 (FIG. 2b) is formed. If a three-layer structure is to be formed, a second etch-stop dielectric layer 48 which may comprise from about 200 to 2,000 angstroms of PECVD silicon dioxide is formed over the surface of barrier layer. A first etch-stop dielectric layer 42, which may comprise from about 200 to 2,000 angstroms of PECVD silicon nitride, is formed, either over second etch-stop dielectric layer 48 if a three-layer interlayer dielectric layer structure is to be formed, or over barrier layer 14 if a two-layer interlayer dielectric layer is to be formed. Finally, isolation dielectric layer 44 is formed over the surface of first etch-stop dielectric layer 42.

At this point in the process, the contact via 18 will be formed to connect the completed antifuse structure to an overlying metal interconnect layer. First, isolation dielectric layer 44 is suitably masked, using conventional photolithography techniques. At step 120, an etching step is used to etch via 18 through isolation dielectric layer using an etchant which is highly selective between isolation dielectric layer 44 and first etch-stop dielectric layer 42. Etchants such as $CHF_3:O_2$ with a 6:1 ratio are suitable for this procedure. An overetch procedure of from about 30–70%, preferably about 50% is employed.

Next, at step 122, the one or more etch stop dielectric layers are removed. The via is etched into first etch-stop dielectric layer 42 etched using an etchant having a high selectivity between first etch-stop dielectric layer 42 and the underlying layer. When a three-layer interlayer dielectric layer is employed, the underlying layer will be second etch-stop dielectric layer 48, preferably formed from silicon dioxide, and an etchant such as $CHF_3:O_2$ with a 1:4 ratio may be employed. When a two-layer interlayer dielectric layer is employed, the underlying layer will be upper barrier layer 66, and an etchant such as $CHF_3:O_2$ with a 1:4 ratio may be employed. An overetch procedure of from about 30–70%, preferably about 50% is employed.

If a three-layer interlayer dielectric layer is employed, a final etching step is performed to continue via 18 through second etch-stop dielectric layer 48 using an etchant having a high selectivity between second etch-stop dielectric layer 48 and upper barrier layer 66. An overetch procedure of from about 30–70%, preferably about 50% is employed. This will etch very little into upper barrier layer 66 because of the high selectivity and the short actual overetch time used when etching a thin oxide.

Next, after removal of the via masking layer by conventional processing techniques, upper electrode 68 may be formed at step 124 using conventional processing techniques to thickness of about 4,000 to 9,000 angstroms, preferably about 7,000 angstroms.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is;

1. A process for fabricating an antifuse via comprising the steps of:

forming a first etch-stop dielectric layer from a first dielectric material over an underlying layer;

forming an isolation dielectric layer from a second dielectric material over said first etch-stop dielectric layer;

etching an antifuse via through said isolation dielectric layer with an etching process having a selectivity between said first and second dielectric materials, performing an over-etch process of from about 30–70% using said first etch-stop dielectric layer as an etch stop; and etching said antifuse via through said first etch-stop dielectric layer with an etching process having a selectivity between said second dielectric material and said underlying layer, performing an over-etch process of from about 30–70% using said underlying layer as an etch stop.

2. A process for fabricating an antifuse via comprising the steps of:

forming a second etch-stop dielectric layer from a first dielectric material over an underlying layer;

forming a first etch-stop dielectric layer from a second dielectric material over said second etch-stop dielectric layer;

forming an isolation dielectric layer from a third dielectric material over said first etch-stop dielectric layer;

etching an antifuse via through said isolation dielectric layer with an etching process having a selectivity between said third and second dielectric materials, performing an over-etch process of from about 30–70% using said first etch-stop dielectric layer as an etch stop;

etching said antifuse via through said first etch-stop dielectric layer with an etching process having a selectivity between said second dielectric material and said first dielectric material, performing an over-etch process of from about 30–70% using said second etch-stop dielectric layer as an etch stop; and etching said antifuse via through said second etch-stop dielectric layer with an etching process having a selectivity between said first dielectric material and said underlying layer, performing an over-etch process of from about 30–70% using said underlying layer as an etch stop.

3. A process for fabricating an antifuse structure, including the steps of:

forming a lower antifuse electrode;

forming a lower barrier layer over said lower antifuse electrode;

forming a first etch-stop dielectric layer from a first dielectric material over said lower barrier layer;

forming an isolation dielectric layer from a second dielectric material over said first etch-stop dielectric layer;

etching an antifuse via through said isolation dielectric layer with an etching process having a selectivity between said first and second dielectric materials, performing an over-etch process of from about 30–70% using said first etch-stop dielectric layer as an etch stop;

etching said antifuse via through said first etch-stop dielectric layer with an etching process having a selectivity between said second dielectric material and said lower barrier layer, performing an over-etch process of from about 30–70% using said lower barrier layer as an etch stop;

forming an antifuse material layer in said antifuse via;

forming an upper barrier layer over said antifuse material layer; and forming an upper antifuse electrode over said upper barrier layer.

4. A process for fabricating an antifuse structure, including the steps of:

forming a lower antifuse electrode;

forming a lower barrier layer over said lower antifuse electrode;

forming a second etch-stop dielectric layer from a first dielectric material over said lower barrier layer;

forming a first etch-stop dielectric layer from a second dielectric material over said second etch-stop dielectric layer;

forming an isolation dielectric layer from a third dielectric material over said first etch-stop dielectric layer;

etching an antifuse via through said isolation dielectric layer with an etching process having a selectivity between said second and third dielectric materials, performing an over-etch process of from about 30–70% using said first etch-stop dielectric layer as an etch stop;

etching said antifuse via through said first etch-stop dielectric layer with an etching process having a selectivity between said first and second dielectric materials, performing an over-etch process of from about 30–70% using said second etch-stop dielectric layer as an etch stop;

etching said antifuse via through said second etch-stop dielectric layer with an etching process having a selectivity between said first dielectric material and said lower barrier layer, performing an over-etch process of from about 30–70% using said lower barrier layer as an etch stop;

forming an antifuse material layer in said antifuse via;

forming an upper barrier layer over said antifuse material layer; and forming an upper antifuse electrode over said upper barrier layer.

5. A process for fabricating an antifuse structure, including the steps of:

forming a lower antifuse electrode;

forming a lower barrier layer over said lower antifuse electrode;

forming an antifuse material layer over said lower barrier layer;

forming a first etch-stop dielectric layer from a first dielectric material over said antifuse material layer;

forming an isolation dielectric layer from, a second dielectric material over said first etch-stop dielectric layer;

etching an antifuse via through said isolation dielectric layer with an etching process having a selectivity between said first and second dielectric materials, performing an over-etch process of from about 30–70% using said first etch-stop dielectric layer as an etch stop;

etching said antifuse via through said first etch-stop dielectric layer with an etching process having a selectivity between said second dielectric material and said antifuse material layer, performing an over-etch process of from about 30–70% using said antifuse material layer as an etch stop;

forming an upper barrier layer in said antifuse via over said antifuse material layer; and forming an upper antifuse electrode over said upper barrier layer.

6. A process for fabricating an antifuse structure, including the steps of:

forming a lower antifuse electrode;

forming a lower barrier layer over said lower antifuse electrode;

forming an antifuse material layer over said lower barrier layer;

forming a second etch-stop dielectric layer from a first dielectric material over said antifuse material layer;

forming a first etch-stop dielectric layer from a second dielectric material over said second etch-stop dielectric layer;

forming an isolation dielectric layer from a third dielectric material over said second etch-stop dielectric layer;

etching an antifuse via through said isolation dielectric layer with an etching process having a selectivity between said second and third dielectric materials, performing an over-etch process of from about 30–70% using said first etch-stop dielectric layer as an etch stop;

etching said antifuse via through said first etch-stop dielectric layer with an etching process having a selectivity between said first and second dielectric materials, performing an over-etch process of from about 30–70% using said second etch-stop dielectric layer as an etch stop;

etching said antifuse via through said second etch-stop dielectric layer with an etching process having a selectivity between said first dielectric material and said antifuse material layer, performing an over-etch process of from about 30–70% using said antifuse material layer as an etch stop;

forming an upper barrier layer in said antifuse via over said antifuse material layer; and forming an upper antifuse electrode over said upper barrier layer.

7. A process for fabricating an antifuse structure, including the steps of:

forming a lower antifuse electrode;

forming a lower barrier layer over said lower antifuse electrode;

forming an antifuse material layer over said lower barrier layer;

forming an upper antifuse electrode from a barrier material over said antifuse material layer;

forming a first etch-stop dielectric layer from a first dielectric material over said upper antifuse electrode;

forming an isolation dielectric layer from a second dielectric material over said first etch-stop dielectric layer; etching a contact via through said isolation dielectric layer with an etching process having a selectivity between said first and second dielectric materials, performing an over-etch process of from about 30–70% using said first etch-stop dielectric layer as an etch stop; and etching said contact via through said first etch-stop dielectric layer with an etching process having a selectivity between said second dielectric material and said upper antifuse electrode, performing an over-etch process of from about 30–70 using said upper antifuse electrode as an etch stop.

8. The process of claim 7, further including the step of forming a metal interconnect layer in said contact via over said upper antifuse electrode.

9. A process for fabricating an antifuse structure, including the steps of:

forming a lower antifuse electrode;

forming a lower barrier layer over said lower antifuse electrode;

forming an antifuse material layer over said lower barrier layer;

forming an upper antifuse electrode from a barrier material over said antifuse material layer;

forming a second etch-stop dielectric layer from a first dielectric material over said upper antifuse electrode;

forming a first etch-stop dielectric layer from a second dielectric material over said second etch-stop dielectric layer;

forming an isolation dielectric layer from a third dielectric material over said first etch-stop dielectric layer;

etching a contact via through said isolation dielectric layer with an etching process having a selectivity between said second and third dielectric materials, performing an over-etch process from about 30–70% using said first etch-stop dielectric layer as an etch stop;

etching said contact via through said first etch-stop dielectric layer with an etching process having a selectivity between said first and second dielectric materials, performing an over-etch process of from about 30–70% using said second etch-stop layer as an etch stop; and etching said contact via through said second etch-stop dielectric layer with an etching process having a selectivity between said first dielectric material and said upper antifuse electrode, performing an over-etch process of from about 30–70% using said upper antifuse electrode as an etch stop.

10. The process of claim 9, further including the step of forming a metal interconnect layer in said via over said upper antifuse electrode.

* * * * *

UNITED STATES PATENT AND TRADEMARK OFFICE
CERTIFICATE OF CORRECTION

PATENT NO. : 5,464,790
DATED : November 7, 1995
INVENTOR(S) : Frank W. Hawley

It is certified that error appears in the above-indentified patent and that said Letters Patent is hereby corrected as shown below:

Column 1, line 28, before "which " delete --:--.

Column 12, line 14, after "from" delete --,--.

Column 13, line 17, before "etching" delete the indent.

Column 13, line 27, after "70" insert --%--.

Signed and Sealed this

Eighteenth Day of June, 1996

Attest:

BRUCE LEHMAN

Attesting Officer

Commissioner of Patents and Trademarks